United States Patent
Mu et al.

(10) Patent No.: US 10,032,945 B2
(45) Date of Patent: Jul. 24, 2018

(54) ELECTRICALLY CONDUCTIVE ADHESIVES COMPRISING BLEND ELASTOMERS

(71) Applicant: E. I. DU PONT DE NEMOURS AND COMPANY, Wilmington, DE (US)

(72) Inventors: Minfang Mu, Shanghai (CN); Zengjun Liu, Shanghai (CN)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 151 days.

(21) Appl. No.: 14/759,927

(22) PCT Filed: Jan. 9, 2014

(86) PCT No.: PCT/US2014/010826
§ 371 (c)(1),
(2) Date: Jul. 8, 2015

(87) PCT Pub. No.: WO2014/110229
PCT Pub. Date: Jul. 17, 2014

(65) Prior Publication Data
US 2015/0357497 A1   Dec. 10, 2015

(30) Foreign Application Priority Data
Jan. 10, 2013  (CN) .......................... 2013 1 0009058

(51) Int. Cl.
| | |
|---|---|
| *H01L 31/05* | (2014.01) |
| *C09J 9/02* | (2006.01) |
| *C09J 123/08* | (2006.01) |
| *C09J 133/10* | (2006.01) |
| *C09D 123/08* | (2006.01) |
| *H01B 1/22* | (2006.01) |
| *H01L 31/0224* | (2006.01) |
| *C08K 3/08* | (2006.01) |
| *C08K 5/14* | (2006.01) |
| *C08K 7/00* | (2006.01) |

(52) U.S. Cl.
CPC .... *H01L 31/0512* (2013.01); *C09D 123/0869* (2013.01); *C09J 9/02* (2013.01); *C09J 123/0853* (2013.01); *C09J 133/10* (2013.01); *H01B 1/22* (2013.01); *H01L 31/022425* (2013.01); *C08K 3/08* (2013.01); *C08K 5/14* (2013.01); *C08K 7/00* (2013.01); *C08L 2203/204* (2013.01); *Y02E 10/50* (2013.01)

(58) Field of Classification Search
USPC ...................... 136/256; 156/244.11
See application file for complete search history.

(56) References Cited

U.S. PATENT DOCUMENTS

| | | | |
|---|---|---|---|
| 5,395,876 A | 3/1995 | Frentzel et al. | |
| 5,759,291 A | 6/1998 | Ichinose et al. | |
| 5,932,339 A | 8/1999 | Sakurai et al. | |
| 6,828,362 B1 | 12/2004 | Lee et al. | |
| 8,163,835 B2 | 4/2012 | Park et al. | |
| 8,165,371 B2 | 4/2012 | Bi et al. | |
| 8,197,718 B2 | 6/2012 | Nakahara et al. | |
| 8,728,352 B2 | 5/2014 | Bae et al. | |
| 8,920,591 B2 | 12/2014 | Kleine Jaeger et al. | |
| 9,123,835 B2 | 9/2015 | Shimizu et al. | |
| 2004/0058240 A1 | 3/2004 | Christensen | |
| 2006/0118767 A1 | 6/2006 | Jang et al. | |
| 2009/0078747 A1 | 3/2009 | Park et al. | |
| 2009/0178834 A1 | 7/2009 | Akutsu et al. | |
| 2010/0028672 A1 | 2/2010 | Yoshioka et al. | |
| 2010/0108140 A1 | 5/2010 | Auman et al. | |
| 2010/0147355 A1* | 6/2010 | Shimizu ............ | H01L 31/02008 136/244 |
| 2010/0209599 A1* | 8/2010 | Van Veen ................. | H01B 1/22 427/126.1 |
| 2012/0012153 A1* | 1/2012 | Azechi ..................... | H01B 1/22 136/244 |
| 2012/0080068 A1 | 4/2012 | Bae et al. | |
| 2012/0312467 A1 | 12/2012 | Kleine et al. | |
| 2013/0139868 A1* | 6/2013 | Zhang .................... | C09K 11/06 136/247 |

(Continued)

FOREIGN PATENT DOCUMENTS

| | | |
|---|---|---|
| CN | 202373593 A | 8/2012 |
| CN | 102277109 B | 1/2013 |

(Continued)

OTHER PUBLICATIONS

Kang et al., Development of High Conductivity Lead (Pb)-Free Conducting Adhesives, IEEE Transactions on Components, Packaging, and Manufacturing Technology—Part A. vol. 21, No. 1, Mar. 1998, pp. 18-22.

Scherff et al., 10×10 cm2 HIT Solar Cells Contacted with Lead-Free Electrical Conductive Adhesives to Solar Cell Interconnectors, Photovoltaic Energy Conversion, Conference Record of the 2006 IEEE 4th World Conference on, vol. 2, Digital Object Identifier: 10.1109/WCPEC.2006.279709, Publication Year: 2006, pp. 1384-1387.

International Search Report dated May 15, 2014 for International Application No. PCT/US2014/010826.

*Primary Examiner* — Mark Kaucher
*Assistant Examiner* — Henry Hu

(57) ABSTRACT

Disclosed herein is an electrically conductive adhesive composition and its use in solar cell modules, wherein the electrically conductive adhesive comprises a polymer matrix and dispersed in the polymer matrix about 40-90 wt % of conductive particles, with the wt % of all components comprised in the compositions totaling to 100 wt %, and wherein the polymer matrix comprises or is formed of a blend of at least one ethylene/alkyl (meth)acrylate copolymer elastomer and at least one ethylene vinyl acetate copolymer at a weight ratio ranging from about 10:90 to about 70:30.

17 Claims, No Drawings

(56) References Cited

U.S. PATENT DOCUMENTS

| | | | |
|---|---|---|---|
| 2015/0041052 A1* | 2/2015 | Zhang | C09B 57/00 156/244.11 |
| 2015/0248946 A1 | 9/2015 | Van Veen et al. | |
| 2015/0353779 A1* | 12/2015 | Mu | H01B 1/22 136/256 |

FOREIGN PATENT DOCUMENTS

| | | |
|---|---|---|
| CN | 102443365 B | 11/2013 |
| CN | 103436197 B | 11/2015 |
| DE | 69630453 T2 | 8/2004 |
| EP | 0351047 A2 | 1/1990 |
| EP | 2408014 A1 | 1/2012 |
| GB | 2085339 A | 4/1982 |
| JP | 56-008415 A | 1/1981 |
| JP | 59-164317 A | 9/1984 |
| JP | 59227966 A | 12/1984 |
| JP | 01-138279 A | 5/1989 |
| JP | 03203949 A | 9/1991 |
| JP | 04-237903 A | 8/1992 |
| JP | 08-286181 A | 11/1996 |
| JP | 11-080682 A | 3/1999 |
| JP | 2001214149 A | 8/2001 |
| JP | 2003253239 A | 9/2003 |
| JP | 2005044524 A | 2/2005 |
| JP | 2005085724 A | 3/2005 |
| JP | 2007-158302 A | 6/2007 |
| JP | 3925571 B2 | 6/2007 |
| JP | 4152163 B2 | 9/2008 |
| JP | 2010037493 A | 2/2010 |
| JP | 2010108845 A | 5/2010 |
| JP | 2010-539650 A | 12/2010 |
| KR | 2007065800 A | 6/2007 |
| KR | 2009053425 A | 5/2009 |
| KR | 2011048100 A | 5/2011 |

* cited by examiner

ELECTRICALLY CONDUCTIVE ADHESIVES COMPRISING BLEND ELASTOMERS

TECHNICAL FIELD

The disclosure is related to a blend elastomer-based electrically conductive adhesives.

BACKGROUND

In solar cell modules, the solar cells have surface electrodes, to which the wiring members (also called electro-conductive interconnect members or ribbons) are connected for extracting power from the cells. The wiring members are usually in the form of metal strips (such as Cu strips) and they are often connected to the surface electrodes by soldering. However, since relatively high temperatures are necessary for such soldering, stresses are applied to the connect structure due to the difference in co-efficiency of thermal shrinkage among the semiconductor structure responsible for power generation, the surface electrodes, the solder, and the wiring members. Such thermal stresses can cause the solar cell to be warped and cracked.

To solve this problem, people have proposed the use of polymer-based electrically conductive adhesives in place of solder to connect the wiring members with the surface electrodes of the solar cells. Such polymer-based electrically conductive adhesives typically are comprised of insulating polymers (such as, epoxy resins, acrylic polymers, phenoxy resins, polyimides, or silicone rubbers) and electro-conductive particles (such as Ag particles), see, for example, U.S. Patent Publication Nos. 2010/0147355 and 2012/0012153. There also have been disclosures of rubber-based or ethylene copolymer-based (such as those based on ethylene vinyl acetate (EVA)) electrically conductive adhesives. However, there is still a need to develop novel polymer-based electrically conductive adhesives with further improved weathering resistance.

SUMMARY

The purpose of the present disclosure is to provide a solar cell module comprising at least one solar cell and at least one wiring member, wherein, the at least one solar cell has at least one surface electrode and the at least one wiring member is connected to the at least one surface electrode via an electrically conductive adhesive; the electrically conductive adhesive is formed of an adhesive composition comprising a polymer matrix and 40-90 wt % of conductive particles dispersed in the polymer matrix, with the wt % of all components comprised in the adhesive composition totaling to 100 wt %; and the polymer matrix comprises a blend of at least one ethylene/alkyl (meth)acrylate copolymer elastomer and at least one ethylene vinyl acetate copolymer at a weight ratio ranging from 10:90 to 70:30.

In one embodiment of the solar cell module, the weight ratio of the at least one ethylene/alkyl (meth)acrylate copolymer elastomer and at least one ethylene vinyl acetate copolymer ranges from 15:85 to 70:30, or from 15:85 to 65:35.

In a further embodiment of the solar cell module, the at least one ethylene/alkyl (meth)acrylate copolymer elastomer comprises polymerized units of ethylene and 40-90 wt %, or preferably 50-80 wt %, or more preferably 50-75 wt % of polymerized units of at least one alkyl (meth)acrylate, based on the total weight of the ethylene/alkyl (meth)acrylate copolymer elastomer.

In a yet further embodiment of the solar cell module, the at least one ethylene/alkyl (meth)acrylate copolymer elastomer is selected from the group consisting of ethylene/methyl acrylate copolymers, ethylene/ethyl acrylate copolymers, ethylene/butyl acrylate copolymers, and combinations of two or more thereof.

In a yet further embodiment of the solar cell module, the at least one ethylene vinyl acetate copolymer comprises polymerized units of ethylene and 5-50 wt %, or preferably 15-45 wt %, or more preferably 20-45 wt % of copolymerized units of vinyl acetates, based on the total weight of the ethylene vinyl acetate copolymer.

In a yet further embodiment of the solar cell module, the at least one ethylene/alkyl (meth)acrylate copolymer elastomer and/or the at least one ethylene vinyl acetate copolymer is cross-linked with a cross-linking agent.

In a yet further embodiment of the solar cell module, the conductive particles are selected from metal particles and non-metal particles.

In a yet further embodiment of the solar cell module, the conductive particles are metal particles, or preferably, the conductive particles are selected from the group consisting of particles of Au, Ag, Ni, Cu, Al, Sn, Zn, Ti, Sn, Bi, W, Pb, and alloys of two or more thereof, or more preferably the conductive particles are selected from particles of Cu, Ag, Ni, and alloys thereof, or yet more preferably, the conductive particles are Ag particles.

In a yet further embodiment of the solar cell module, 40-85 wt % or 45-83 wt % of the conductive particles are dispersed in the polymer matrix, based on the total weight of the adhesive composition.

In a yet further embodiment of the solar cell module, the at least one solar cell has a front surface electrode and a back surface electrode, and wherein there are one or more front wiring members connected to the front surface electrode via the electrically conductive adhesive and one or more back wiring members connected to the back surface electrode via the electrically conductive adhesive.

In a yet further embodiment of the solar cell module, the at least one solar cell is a wafer-based solar cell.

In a yet further embodiment of the solar cell module, the at least one solar cell is a thin film solar cell.

In accordance with the present disclosure, when a range is given with two particular end points, it is understood that the range includes any value that is within the two particular end points and any value that is equal to or about equal to any of the two end points.

DETAILED DESCRIPTION

Disclosed herein are electrically conductive adhesive compositions that comprise a polymer matrix and about 40-90 wt % of conductive particles dispersed in the polymer matrix, with the wt % of all components comprised in the composition totaling to 100 wt %. The polymer matrix comprises or is formed of a blend elastomer of at least one ethylene/alkyl (meth)acrylate copolymer elastomer and at least one ethylene vinyl acetate copolymer (EVA) at a weight ratio of about 10:90 to about 70:30.

Ethylene/alkyl (meth)acrylate copolymer elastomers, also known as AEM rubbers, are derived from copolymerization of polymerized units of ethylene and about 45-90 wt %, or about 50-80 wt %, or about 50-75 wt % of polymerized units of at least one alkyl (meth)acrylate, based on the total weight of the ethylene/alkyl (meth)acrylate copolymer elastomer. The term "(meth)acrylate" is used herein to refer to esters of methacrylic acids and/or esters of acrylic acids, and the term "meth" is used herein to refer to —H or branched or non-branched groups $C_1$-$C_{10}$ alkyl, and the term "alkyl" is used herein to refer to —H or branched or non-branched groups of $C_1$-$C_{12}$ alkyl, $C_1$-$C_{20}$ alkoxyalkyl, $C_1$-$C_{12}$ cyanoalkyl, or $C_1$-$C_{12}$ fluoroalkyl. The alkyl (meth)acrylate groups used herein include, without limitation, alkyl acrylate, alkyl methacrylates, alkyl ethacrylates, alkyl propacrylates, and alkyl hexacrylates, alkoxyalkyl methacrylates, alkoxyalkyl ethacryates, alkoxyalkyl propacrylates and alkoxyalkyl hexacrylates. The alkyl groups may be substituted with cyano groups or one or more fluorine atoms. That is, the alkyl group may be a $C_1$-$C_{12}$ cyanoalkyl group or a $C_1$-$C_{12}$ fluoroalkyl group. The ethylene/alkyl (meth)acrylate copolymers may also comprise copolymerized units of more than one species of the alkyl (meth)acrylates, for example two different alkyl acrylate monomers. For example, the ethylene/alkyl (meth)acrylate copolymers used herein include, without limitation, ethylene/methyl acrylate copolymers (EMA), ethylene/ethyl acrylate copolymers (EEA), and ethylene/butyl acrylate copolymers (EBA).

Moreover, the ethylene/alkyl (meth)acrylate copolymer elastomers used herein may optionally further comprise up to about 5 wt % of a functionalized comonomer, based on the total weight of the ethylene/alkyl (meth)acrylate copolymer elastomer. The optional functionalized comonomers used herein, include, without limitation, (meth)acrylate glycidyl esters (such as glycidyl methacrylate), chlorovinyl ether, maleic acids, and other comonomers having one or more reactive groups including acid, hydroxyl, anhydride, epoxy, isocyanates, amine, oxazoline, chloroacetate, carboxylic ester moieties, or diene functionality. Also conceivable is that the ethylene/alkyl (meth)acrylate copolymer elastomers used herein are made by copolymerizing ethylene and more than one (e.g., two) alkyl (meth)acrylate monomers. Examples are ethylene/alkyl (meth)acrylate copolymer elastomers made by polymerizing ethylene, methyl acrylate, and a second acrylate (such as butyl acrylate).

It is also conceivable that the ethylene/alkyl (meth)acrylate copolymer elastomers comprised in the blend elastomers also may be blends of two or more ethylene/alkyl (meth)acrylate copolymer elastomers.

The ethylene/alkyl (meth)acrylate copolymer elastomers may be prepared by various processes well known in the polymer art. For example, the copolymerization can be run as a continuous process in an autoclave reactor. Or alternatively, the ethylene/alkyl (meth)acylate copolymers used herein may be produced at high pressure and elevated temperature in a tubular reactor or the like. The copolymer can be separated from the product mixture with the unreacted monomers and solvent (if used) by conventional means, e.g., vaporizing the non-polymerized materials and solvent under reduced pressure and at an elevated temperature.

The ethylene/alkyl (meth)acrylate copolymer elastomers used herein are also available commercially. Exemplary ethylene/alkyl (meth)acrylate copolymer elastomers may include those available from E. I. du Pont de Nemours and Company, U.S.A. (hereafter "DuPont") under the trade name Vamac®.

The ethylene/vinyl acetate copolymers (EVA) used here are derived from copolymerization of polymerized units of ethylene and about 5-50 wt %, or about 15-45 wt %, or about 20-45 wt % of copolymerized units of vinyl acetates, based on the total weight of the EVA. In accordance with the present disclosure, the ethylene vinyl acetate copolymers used herein may also comprise up to about 35 wt %, or up to about 25 wt %, or up to about 20 wt % of copolymerized units of one or more additional monomers. Such one or more additional comonomers may include, without limitation, (meth)acrylic acid, maleic anhydride, butyl acrylate, carbon monoxide, and combinations of two or more thereof. Suitable ethylene vinyl acetate copolymers also may be obtained commercially. For example, Elvax® EVA resins available from DuPont; Evatane™ EVA copolymers available from Arkerma, Inc. (France); Escorene™ EVA resins available from Exxonmobil Chemical (U.S.A.); Evaflex® EVA resins available from DuPont-Mitsui Polychemicals Co. Ltd. (Japan); or Ateva™ EVA resins available from Celanese (Canada) may be used herein.

Within blend elastomers used herein, the weight ratio of the at least one ethylene/alkyl (meth)acrylate copolymer elastomer and the at least one ethylene vinyl acetate copolymer may range from about 10:90 to about 70:30, or 15:85 to about 70:30, or about 15:85 to about 65:35.

Preferably, ethylene/alkyl (meth)acrylate copolymer elastomers and/or the ethylene vinyl acetate copolymers comprised in the blend elastomers are cross-linked with cross-linking agents.

The cross-linking agents used herein may be any suitable peroxide. The term "peroxide" refers to an organic compound that includes one or more peroxide, i.e., O—O, linkages. Suitable peroxides are disclosed, e.g., in Aldrich Catalogue of Fine Chemicals. Heating the peroxide causes it to generate radicals which react with the components of the composition to cause covalent cross-links in the mixture. By regulating the amounts and types of organic peroxide present in the composition, the relative rates of radical generation, abstraction, and cross-linking steps can be controlled.

Exemplary peroxide cross-linking agents that are suitable herein include, without limitation, methylethylketone peroxide; dicumyl peroxide; 2,5-dimethyl-2,5-di(t-butylperoxy)hexane; 1,1-bis(t-butylperoxy)-3,3,5-tr-imethylcyclohexane; 1,1-di-(t-butylperoxy)cyclohexane; 2,2'-bis(t-butylperoxy)diisopropylbenzene; 4,4'-bis(t-butylperoxy) butyl valerate; ethyl 3,3-bis(t-butylperoxy)butyrate; t-butyl cumyl peroxide; di[(t-butylperoxy)-isopropyl]benzene; t-butyl peroxide; 6,6,9,9-tetramethyl-3-methyl-3,n-butyl-1, 2,4,5-tetraoxycyclononane; 6,6,9,9-tetramethyl-3-methyl-3-ethyl carbonylmethyl-1,2,4,5-tetraoxy-cyclononane; ethyl 3,3-di(t-butylperoxy)-butyrate; dibenzoyl peroxide; 2,4-di-chlorobenzoyl peroxide; OO-t-butyl-O-(2-ethylhexyl)mono peroxycarbonate; 2,5-dimethyl-2,5-di-(t-butylperoxy)-3-hexyne; and combinations of two or more thereof.

The cross-linking agents used herein are also available commercially. Exemplary cross-linking agents may include those available from AkzoNobel Corporate, the Netherlands, under the trade name Perkadox™; or from Arkerma, Inc. under the trade name Luperox™. Suitable dicumyl peroxide (DCP) cross-linking agents may be obtained from Shanghai Fangruida Chemical Co. Ltd, China or Hangzhou Hi-Tech Fine Chemical Co. Ltd. China.

Based on the total volume of the electrically conductive adhesive composition, the polymer matrix may be present at a level of about 10-60 wt %, or about 15-60 wt %, or about 17-55 wt %, based on the total weight of the electrically conductive adhesive composition.

The conductive particles used herein provide electrical conductivity in the adhesive composition upon circuit connection. The conductive particles may include metal particles, non-metal particles, metal coated particles, and combinations thereof. Suitable metal particles include, without limitation, particles of Au, Ag, Ni, Cu, Al, Sn, Zn, Ti, Sn, Bi, W, Pb, and alloys of two or more thereof. Suitable non-metal particles include, without limitation, carbon nanotube, graphene, polyaniline, polyacetylene, and polypyrrole, and combinations of two or more thereof. The metal coating material used in the metal coated particles may include, without limitation, Au, Ag, Ni, and combinations of two or more thereof. Suitable metal coated particles include, without limitation, Ag-coated glass beads, Ag-coated polystyrene particles, Ag-coated Cu particles, Ni-coated Cu particles, and combinations of two or more thereof. The size of the conductive particles may be determined depending on the pitch of circuits and may be, e.g., about 0.1 to about 50 μm, depending on the intended application.

Based on the total weight of the electrically conductive adhesive composition, the conductive particles may be present at a level of about 40-90 wt %, or about 40-85 wt %, or about 45-83 wt %.

In one embodiment of the electrically conductive adhesive composition disclosed herein, the polymer matrix is formed of blend elastomer of at least one ethylene/alkyl (meth)acrylate copolymer elastomer and at least one ethylene vinyl acetate copolymer (EVA) at a weight ratio of about 10:90 to about 70-30 and the conductive particles are selected from particles of Cu, Ag, Ni, and alloys thereof. In a further embodiment of the electrically conductive adhesive composition disclosed herein, the conductive particles are selected from Ag particles.

Further disclosed herein are electrically conductive sheets or tapes formed of the electrically conductive adhesive compositions disclosed hereabove.

Yet further disclosed herein are solar cell modules that comprise one or more solar cells and the electrically conductive adhesives. In such embodiments, the electrically conductive adhesives are included to electrically connect the surface electrodes of the solar cells with the wiring members (also called ribbons). The wiring members are included to electrically connect the solar cells in series and/or in parallel and to form conductive paths for extracting the electric power out from the modules.

The solar cells used herein may be any article or material that can convert light into electrical energy. For example, the solar cells used herein include, without limitation, wafer-based solar cells (e.g., c-Si or mc-Si based solar cells) and thin film solar cells (e.g., a-Si, μc-Si, CdTe, copper indium selenide (CIS), copper-indium-gallium selenide (CIGS), light absorbing dyes, or organic semiconductor based solar cells).

The surface electrodes of the solar cells may be made of any suitable materials that can provide electrical conduction. For example, the surface electrodes may be formed by printing (e.g., screen printing or ink-jet printing) conductive paste over the solar cell surfaces. Specific examples of the suitable paste materials include, without limitation, silver paste, glass paste containing silver, gold paste, carbon past, nickel paste, aluminum paste, transparent conducting oxide (TCO) (such as indium tin oxide (ITO) or aluminum zinc oxide (AZO).

The wiring members, however, may be formed of any high conductive materials, such as copper, silver, aluminum, gold, nickel, cadmium, and alloys thereof.

The surface electrodes of the solar cells may be in any suitable patterns and the connection between the surface electrodes and the wiring member may be in any suitable forms.

For example, in a wafer-based solar cell module, each solar cell may comprise a front surface electrode and a back surface electrode, wherein the top surface electrode may be comprised of a plurality of parallel conductive fingers and two or more conductive bus bars perpendicular to and connecting the conductive fingers, and wherein the back surface electrode may be comprised of a layer conductive paste and two or more conductive bus bars. In certain embodiments, the conductive fingers and the conductive bus bars are formed of silver paste and the layer of conductive paste comprised in the back surface electrode may be formed of aluminum paste. In such embodiments, the wiring members are connected to the front and back surface electrodes by adhering to the bus bars of the front and back electrodes via the electrically conductive adhesives disclosed herein.

In further embodiments, the front and/or back surface electrodes comprised in the solar cells may be free of bus bars. That is to say, for example, each of the solar cells comprises a front surface electrode that is formed of the plurality of conductive fingers only without bus bars and a back surface electrode that is formed of a layer of conductive paste and two or more conductive bus bars. In such embodiments, the wiring members are connected to the front surface electrode by adhering to the conductive fingers via the electrically conductive adhesives and to the back surface electrode by adhering to the bus bars via the electrically conductive adhesives. Or, each of the solar cells comprises a front surface electrode that is formed of the plurality of conductive finger and two or more bus bars and a back surface electrode that is formed of the conductive paste only without the bus bars. In such embodiments, the wiring members are connected to the front surface electrode by adhering to the bus bars via the electrically conductive adhesives and to the back surface electrode by adhering to the conductive paste via the electrically conductive adhesives. Or, each of the solar cells comprises a front surface electrode that is formed of the plurality of conductive fingers only without bus bars and a back surface electrode that is formed of the conductive paste only without the bus bars. In such embodiments, the wiring members are connected to the front surface electrode by adhering to the conductive fingers via the electrically adhesives and to the back surface electrode by adhering to the conductive paste via the electrically conductive adhesives.

In the form of thin film solar cell modules, the opposite surface electrodes are typically formed of transparent TCO layers or metal grids. In certain embodiments, the back surface electrodes may also be formed of metal films, such as Al, TiN, Zn, Mo, stainless steel). In such embodiments, the wiring members may be connected to the electrodes by adhering to the electrodes via the electrically conductive adhesives. In certain embodiments, however, bus bars may be included and connected to each of the electrodes and the wiring members may be connected to the electrodes by adhering to the bus bars via the electrically conductive adhesives.

Any suitable process may be used when adhering the wiring member(s) to the surface electrode(s) via the blend elastomer-based electrically conductive adhesives. Preferably, the process may include first preparing a pre-formed film or sheet of the blend elastomer-based electrically conductive composition and then laminating the wiring member(s) over the surface electrode(s) with the pre-formed electrically conductive film or sheet inbetween. And, the pre-formed electrically conductive film or sheet may be prepared by any suitable methods, such as casting, extrusion, calendaring, etc.

As demonstrated by the examples below, it is found that, compared to ethylene/alkyl (meth)acrylate elastomer-based or EVA-based electrically conductive adhesives, the blend elastomer-based electrically conductive adhesives disclosed herein exhibit very much improved resistance to thermal cycling.

The following Examples and Comparative Examples are provided in order to set forth particular details of one or more embodiments. However, it will be understood that the embodiments are not limited to the particular details described.

EXAMPLES

Material:
- Ag-1: silver flakes and crystals with a particle size of 3-5 μm obtained from Kunming Noble Metal Electronic Materials Co. Ltd.;
- Ag-2: silver powders with a particle size of 5.4-11 μm obtained from DuPont;
- Ethylene Vinyl Acetate (EVA): an ethylene vinyl acetate copolymer resin (33 wt % vinyl acetate) obtained from DuPont under the trade name Elvax® PV1650;
- Ethylene/methyl acrylate copolymer (E/MA): an ethylene/acrylate copolymer comprising 62 wt % methyl acrylate and having a Mooney viscosity (ML1+4, 100° C.) of 22;
- Peroxide (PO): OO-tert-Butyl O-2-(ethylhexyl) monoperoxycarbonate, purchased from LanZhou Agent Plant (China);
- Silane Coupling Agent (SCA): 3-glycidoxypropyltriethoxysilane obtained from Shin-Etsu Chemical (Japan) under the trade name KBM403;
- Antioxidant (AO): 2',3-bis [[3-[3,5-di-tert-butyl-4-hydroxyphenyl] propionyl]] propionohydrazide obtained from BASF (Germany) under the trade name Irganox™ MD1024;
- ECA-1: AEM-based electrically conductive adhesive (with a final Ag concentration of 78 wt %) that was prepared as follows: (i) mixing 33 g of AEM with 0.4 g PO, 0.3 g SCA, and 0.12 g AO using a spatula and (ii) compounding 92 g Ag-1 and 25 g Ag-2 into the mixture from step (i) using a Brabender at 80° C. for 10 minutes to obtain the electrically conductive adhesive;
- ECA-2: a blend elastomer-based (BE-based) electrically conductive adhesive (with a final Ag concentration of 78 wt %) that was prepared as follows: (i) mixing 24.75 g AEM and 8.25 g EVA with 0.4 g PO, 0.3 g SCA, and 0.12 g AO using a spatula and (ii) compounding 92 g Ag-1 and 25 g Ag-2 into the mixture from step (i) using a Brabender at 80° C. for 10 minutes to obtain the electrically conductive adhesive;
- ECA-3: a blend elastomer-based (BE-based) electrically conductive adhesive (with a final Ag concentration of 78 wt %) that was prepared as follows: (i) mixing 8.25 g AEM and 24.75 g EVA with 0.4 g PO, 0.3 g SCA, and 0.12 g AO using a spatula and (ii) compounding 92 g Ag-1 and 25 g Ag-2 into the mixture from step (i) using a Brabender at 80° C. for 10 minutes to obtain the electrically conductive adhesive;
- ECA-4: a blend elastomer-based (BE-based) electrically conductive adhesive (with a final Ag concentration of 78 wt %) that was prepared as follows: (i) mixing 16.5 g AEM and 16.5 g EVA with 0.4 g PO, 0.3 g SCA, and 0.12 g AO using a spatula and (ii) compounding 82 g Ag-1 and 35 g Ag-2 into the mixture from step (i) using a Brabender at 80° C. for 10 minutes to obtain the electrically conductive adhesive;
- ECA-5: a blend elastomer-based (BE-based) electrically conductive adhesive (with a final Ag concentration of 78 wt %) that was prepared as follows: (i) mixing 16.5 g AEM and 16.5 g EVA with 0.4 g PO, 0.3 g SCA, and 0.12 g AO using a spatula and (ii) compounding 92 g Ag-1 and 25 g Ag-2 into the mixture from step (i) using a Brabender at 80° C. for 10 minutes to obtain the electrically conductive adhesive;
- ECA-6: EVA-based electrically conductive adhesive (with a final Ag concentration of 78 wt %) that was prepared as follows: (i) mixing 33 g of EVA with 0.4 g PO, 0.3 g SCA, and 0.12 g AO using a spatula and (ii) compounding 92 g Ag-1 and 25 g Ag-2 into the mixture from step (i) using a Brabender at 80° C. for 10 minutes to obtain the electrically conductive adhesive;
- c-Si Cell (c-Si): monocrystalline solar cell obtained from Motech (Suzhou) Renewable Energy Co., Ltd. (China) under the trade name XS125-165R 5", which had a dimension of 125×125 mm (+0.5 mm) and included a pair of 1.6 mm wide silver bus bars and a pair of 2.8 mm wide silver/aluminum discontinuous soldering pads;
- EVA Sheet (EVAS): Revax™ 767 ethylene vinyl acetate (EVA) sheet (500 μm thick) obtained from Wenzhou RuiYang Photovoltaic Material Co. Ltd. (China);
- Glass Sheet (GS): 3.2 mm thick tempered glass purchased from Dongguan CSG Solar Glass Co., Ltd. (China);
- TPT Backsheet (TPT): Akasol™ PTL 3HR 1000V backsheet for photovoltaic modules obtained from Krempel Group (Germany);

Comparative Example CE1-CE3 and Examples E1-E3

In CE, a one-cell module was prepared as follows: (i) preparing ECA-coated Cu strips by first hot pressing (at 100° C.) ECA-1 into a 50 μm thick film and then laminating (at 100° C.) the ECA film over a Cu foil (105 μm thick) followed by cutting into 2 mm wide strips; (ii) aligning two ECA-coated Cu strips over each of the two bus bars on the front side of the c-Si cell with the ECA-1 coating layer of the Cu strips in contact with the bus bars and aligning the other two ECA-coated Cu strips over each of the two soldering pads on the back side of the c-Si cell with the ECA-1 coating layer of the Cu strips in contact with the soldering pads; (iii) connecting the two front side Cu strips with a first Sn/Pd-coated Cu ribbon by soldering and connecting the two back side Cu strips with a second Sn/Pd-coated Cu ribbon by soldering; (iv) placing the c-Si cell between two layers of EVA and then a layer of GS to the front side and a layer of TPT to the back side of the c-Si cell; (v) laminating the assembly using a Meier ICOLAM™ 10/08 laminator (Meier Vakuumtechnik GmbH (Germany)) at a pressure of 1 atm and a temperature of 145° C. for 15 minutes to form the final one-cell module, in which each of first and second Sn/Pd-coated Cu ribbons having one end extending out of the module.

In CE2, a one-cell module was prepared the same way as described in CE1, with the exception that ECA-2 was used in place of ECA-1.

In E1, a one-cell module was prepared the same way as described in CE1, with the exception that ECA-3 was used in place of ECA-1.

In E2, a one-cell module was prepared the same way as described in CE1, with the exception that ECA-4 was used in place of ECA-1.

In E3, a one-cell module was prepared the same way as described in CE1, with the exception that ECA-5 was used in place of ECA-1.

In CE3, a one-cell module was prepared the same way as described in CE1, with the exception that ECA-6 was used in place of ECA-1.

For each of the modules prepared in CE1-CE3 and E1-E3, the power output of the module as prepared ($P_{Initial}$) and the power output of the module post 50, 100, 150, and 200 cycles of thermal cycling tests ($P_{TC}$) were measured using Spi-Sun Simulator™ 3500SLP (Spire Corporation (U.S.A.)). The power loss ($P_{Loss}$) post various cycles of thermal cycles was calculated as follows and tabulated in Table 1:

$$P_{Loss}=(P_{TC}-P_{Initial})/P_{Initial}$$

During thermal cycling tests were conducted using a ETCU 110 Solar Panel Environmental Test Chamber (manufactured by Thermal Product Solutions (U.S.A.)) and in each cycle, the temperature of the chamber was first set at 25° C., decreased to −40° C. at a rate of 1° C./min, stabilized at −40° C. for 55 minutes, increased to 85° C. at a rate of 1° C./min, stabilized at 85° C. for 55 minutes, and then decreased back to 25° C. at a rate of 1° C./min.

As demonstrated by the examples, when AEM-based ECA (CE1), or EVA-based ECA (CE3) was used, the efficiency of solar cell modules could be decreased by up to 5-9% after 200 cycles of thermal cycling test. And, even when blend elastomer-based ECA with low EVA content (CE2, in which the weight ratio of AEM and EVA was 75:25) was used, the reduction of solar efficiency post thermal cycling remained at about 5%. However, when blend elastomer-based ECA high EVA content (E1-E3, in which the weight ratio of AEM and EVA were 25:75 or 50:50) were used, the reduction of solar efficiency post 200 cycles of thermal cycling was decreased to 2.5%.

TABLE 1

| | CE1 | CE2 | E1 | E2 | E3 | CE3 |
|---|---|---|---|---|---|---|
| Electrically Conductive Adhesive Type | | | | | | |
| | AEM-based | BE-based | BE-based | BE-based | BE-based | EVA-based |
| AEM:EVA (by weight) | 100:0 | 75:25 | 25:75 | 50:50 | 50:50 | 0:100 |
| Properties | | | | | | |
| 50x TC (%) | −4.8 | −3 | −1.3 | −1.5 | −0.9 | −2.1 |
| 100x TC (%) | −7.5 | −4.1 | −1.8 | −1.3 | −1.2 | −3.6 |
| 150x TC (%) | −8.2 | −5.3 | −2.9 | −0.5 | −0.9 | −3.9 |
| 200x TC (%) | −9.2 | −5.5 | −2.5 | −1.6 | −2.1 | −5 |

Example E4

In E4, a one-cell module was prepared as follows: (i) preparing electrically conductive adhesive (ECA) strips (2 mm wide and 50 μm thick) by hot pressing ECA-3 (at 100° C.) over a release film followed by cutting; (ii) placing a c-Si cell front side up over a 100° C. hot plate and maintaining the cell over the hot plate while covering the two bus bars on the front side of the c-Si cell with the ECA strips, removing release films from ECA strips, and aligning Cu strips (2 mm wide) over each of the ECA strips; (iii) flipping and maintaining the c-Si cell over the hot plate while covering the two soldering pads on the back side of the c-Si cell with ECA strips, removing release films from the ECA strips, and aligning Cu strips (2 mm wide) over each of the ECA strips; (iv) removing the cell from the hot plate and connecting the two front side Cu strips with a first Sn/Pd-coated Cu ribbon by soldering and connecting the two back side Cu strips with a second Sn/Pd-coated Cu ribbon by soldering; (vi) placing the c-Si cell between two layers of EVA and then a layer of GS to the front side and a layer of TPT to the back side of the c-Si cell; (vii) laminating the assembly using a Meier ICOLAMTM 10/08 laminator (Meier Vakuumtechnik GmbH (Germany)) at a pressure of 1 atm and a temperature of 145° C. for 15 minutes to form the final one-cell module, in which each of first and second Sn/Pd-coated Cu ribbons having one end extending out of the module.

What is claimed is:

1. A solar cell module comprising at least one solar cell and at least one wiring member,
    wherein,
    (i) the at least one solar cell has at least one surface electrode and the at least one wiring member is connected to the at least one surface electrode via an electrically conductive adhesive;
    (ii) the electrically conductive adhesive is formed of an adhesive composition comprising a polymer matrix and 40-90 wt % of electrically conductive particles dispersed in the polymer matrix, with the wt% of all components comprised in the adhesive composition totaling to 100 wt %; and
    (iii) the polymer matrix comprises a polymer blend of at least one ethylene/alkyl (meth)acrylate copolymer elastomer and at least one ethylene/vinyl acetate copolymer at a weight ratio ranging from 10:90 to 70:30;
        wherein the at least one ethylene/alkyl (meth)acrylate copolymer elastomer comprises polymerized units of ethylene and 40-90 wt % of polymerized units of at least one alkyl (meth)acrylate, based on the total weight of the ethylene/alkyl (meth)acrylate copolymer elastomer; and
        wherein the at least one ethylene/vinyl acetate copolymer comprises polymerized units of ethylene and 5-50 wt % of copolymerized units of vinyl acetates, based on the total weight of the ethylene/vinyl acetate copolymer.

2. The solar cell module of claim 1, wherein the weight ratio of the at least one ethylene/alkyl (meth)acrylate copolymer elastomer and at least one ethylene/vinyl acetate copolymer ranges from 15:85 to 70:30.

3. The solar cell module of claim 1, wherein the at least one ethylene/alkyl (meth)acrylate copolymer elastomer is selected form the group consisting of ethylene/methyl (meth)acrylate copolymers, ethylene/ethyl (meth)acrylate copolymers, ethylene/butyl (meth)acrylate copolymers.

4. The solar cell module claim 1, wherein the at least one ethylene/alkyl (meth)acrylate copolymer elastomer and/or the at least one ethylene/vinyl acetate copolymer is cross-linked with a cross-linking agent.

5. The solar cell module of claim 1, wherein the electrically conductive particles are selected from metal particles and non-metal particles.

6. The solar cell module of claim 5, wherein the electrically conductive particles are metal particles selected from particles of Cu, Ag, Ni, or alloys thereof.

7. The solar cell module of claim 5, wherein the electrically conductive particles are metal particles selected from the group consisting of particles of Au, Ag, Ni, Cu, Al, Sn, Zn, Ti, Sn, Bi, W, Pb, and alloys of two or more thereof.

8. The solar cell module of claim 7, wherein 40-85 wt % of the electrically conductive particles are dispersed in the polymer matrix, based on the total weight of the adhesive composition.

9. The solar cell module of claim 1, wherein 40-85 wt % of the electrically conductive particles are dispersed in the polymer matrix, based on the total weight of the adhesive composition.

10. The solar cell module of claim 1, wherein the at least one solar cell has a front surface electrode and a back surface electrode, and wherein there are one or more front wiring members connected to the front surface electrode via the electrically conductive adhesive and one or more back wiring members connected to the back surface electrode via the electrically conductive adhesive.

11. The solar cell module of claim 10, wherein the at least one solar cell is a wafer-based solar cell.

12. The solar cell module of claim 10, wherein the at least one solar cell is a thin film solar cell.

13. The solar cell module of claim 1, wherein the at least one ethylene/alkyl (meth)acrylate copolymer elastomer comprises polymerized units of ethylene and 50-75 wt % of polymerized units of at least one alkyl (meth)acrylate, based on the total weight of the ethylene/alkyl (meth)acrylate copolymer elastomer.

14. The solar cell module of claim 1, wherein the at least one ethylene/vinyl acetate copolymer comprises polymerized units of ethylene and 20-45 wt % of copolymerized units of vinyl acetates, based on the total weight of the ethylene vinyl acetate copolymer.

15. The solar cell module claim 1, wherein the at least one ethylene/alkyl (meth)acrylate copolymer elastomer and/or the at least one ethylene/vinyl acetate copolymer is cross-linked with a cross-linking agent.

16. The solar cell module claim 3, wherein the at least one ethylene/alkyl (meth)acrylate copolymer elastomer and/or the at least one ethylene/vinyl acetate copolymer is cross-linked with a cross-linking agent.

17. The solar cell module claim 1, wherein the at least one ethylene/alkyl (meth)acrylate copolymer elastomer and/or the at least one ethylene/vinyl acetate copolymer is cross-linked with a cross-linking agent.

* * * * *